US007129875B1

(12) United States Patent
Altun et al.

(10) Patent No.: US 7,129,875 B1
(45) Date of Patent: Oct. 31, 2006

(54) TRACKING REFERENCE SYSTEM FOR ANALOG-TO-DIGITAL CONVERTER SYSTEMS

(75) Inventors: Oguz Altun, Richardson, TX (US); Vijaya B. Rentala, Plano, TX (US); Gabriel J. Gomez, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/178,191

(22) Filed: Jul. 8, 2005

Related U.S. Application Data

(63) Continuation-in-part of application No. 10/699,585, filed on Oct. 31, 2003, now Pat. No. 6,930,624.

(51) Int. Cl.
*H03M 3/00* (2006.01)

(52) U.S. Cl. ...................................... 341/143; 341/120

(58) Field of Classification Search ................ 341/143, 341/172, 155, 144, 118, 120
See application file for complete search history.

(56) References Cited

U.S. PATENT DOCUMENTS 6,011,501 A * 1/2000 Gong et al. ................. 341/150
6,040,793 A 3/2000 Ferguson, Jr. et al.
6,201,835 B1 * 3/2001 Wang ......................... 375/247
2005/0116850 A1 6/2005 Nelson
2005/0123072 A1 * 6/2005 Guimaraes .................. 375/319
2005/0206543 A1 * 9/2005 Draxelmayr ................ 341/143

OTHER PUBLICATIONS

Un-Ku Moon, et al.: "*A Switched-Capacitor Dac with Analog Mismatch Correction*"; Dept. of Electrical and Computer Engineering, Owen Hall, Oregon State University, Corvallis, OR 97331-3211, USA, no date.

"*Demystifying Sigma-Delta ADCs*"; Dallas Semiconductor Maxim; http://www.maxim-ic.com/appnotes.cfm/appnote_number 1870; pp. 1-13, no date.

* cited by examiner

*Primary Examiner*—Peguy JeanPierre
(74) *Attorney, Agent, or Firm*—Steven A. Shaw; W. James Brady; Frederick J. Telecky, Jr.

(57) ABSTRACT

An analog-to-digital (A/D) converter system is provided that compensates for operating variations associated with one or more passive components of the A/D converter. In one aspect of the present invention, the A/D converter system comprises a sigma delta modulator having at least one passive component and a feedback path that includes at least one switched digital-to-analog converter (DAC), and a tracking reference generator that provides compensated reference signals to the at least one switched DAC for providing feedback to the sigma delta modulator. The compensated reference signals include inverse variations that cancel operating variations associated with the at least one passive component.

20 Claims, 3 Drawing Sheets

TRACKING REFERENCE SYSTEM FOR ANALOG-TO-DIGITAL CONVERTER SYSTEMS

CLAIM OF PRIORITY UNDER 35 U.S.C. §120

This application is a Continuation-In-Part to U.S. patent application Ser. No. 10/699,585 filed on Oct. 31, 2003, now U.S. Pat. No. 6,930,624, issued on Aug. 16, 2005, entitled "CONTINUOUS TIME FOURTH ORDER DELTA SIGMA ANALOG-TO-DIGITAL CONVERTER.".

TECHNICAL FIELD

The present invention relates generally to electrical circuits, and more particularly to a tracking reference system for analog-to-digital converter systems.

BACKGROUND

Analog-to-digital (A/D) converters are electrical circuit devices that convert continuous signals, such as voltages or currents, from the analog domain to the digital domain, in which the signals are represented by numbers. A variety of A/D converter types exist, including flash A/Ds, sub-ranging A/Ds, successive approximation A/Ds, and integrating A/Ds. Another type is known as a sigma delta (e.g., ΣΔ) or delta sigma A/D converter, which includes a sigma delta modulator that samples an analog signal at a very high sampling rate (oversampling) in order to perform a noise shaping function. The oversampling is commonly performed at a multiple of the Nyquist rate ($F_N$) for a given input signal frequency content (e.g., sampling frequency $F_S$ is 10 to 1000 times $F_N$), wherein quantization noise power is spread over a bandwidth equal to the sampling frequency, thereby reducing the noise density in the band of interest. Digital filtering is then employed on the digital output to achieve a high resolution. Decimation may then be employed to reduce the effective sampling rate back to the "Nyquist" rate. Sigma delta data converters also typically include a loop filter in the forward signal path that operates to push some of the quantization noise into the higher frequency spectrum beyond the band of interest.

SUMMARY

In one aspect of the present invention, an analog-to-digital (A/D) converter system is provided. The A/D converter system comprises a sigma delta modulator having at least one passive component and a feedback path that includes at least one switched digital-to-analog converter (DAC), and a tracking reference generator that provides compensated reference signals to the at least one switched DAC for providing feedback to the sigma delta modulator. The compensated reference signals include inverse variations that cancel operating variations associated with the at least one passive component.

In another aspect of the present invention, a continuous time sigma delta analog-to-digital (A/D) converter system is provided that comprises a sigma delta modulator having an input resistor associated with a first stage of the sigma delta modulator and a feedback path that includes a switched capacitor DAC with at least one capacitor. The A/D converter system further comprises a tracking reference generator that provides compensated reference signals to the switched capacitor DAC for providing feedback to the first stage of the sigma delta modulator. The tracking reference generator includes a matching resistor corresponding to the input resistor and a same type capacitor as the at least one capacitor. The matching resistor and same type capacitor are configured to generate compensated reference signals having inverse variations that cancel operating variations associated with the input resistor and the at least one capacitor.

In yet another aspect of the present invention, a mobile communication unit is provided. The mobile communication unit comprises an antenna operative to receive wireless signals, a receiver front end coupled to the antenna that filters and amplifies the received wireless signals and a continuous time analog-to-digital (A/D) converter that converts the received wireless signals to a digital representation of the received wireless signals. The A/D converter comprises a sigma delta modulator having at least one passive component and a feedback path that includes at least one switched DAC, and a tracking reference generator that provides compensated reference signals to the at least one switched DAC for providing feedback to the sigma delta modulator. The compensated reference signals include inverse variations that cancel operating variations associated with the at least one passive component. The mobile communication unit also includes a system control that processes the digital representation of the received wireless signal, and a memory coupled to the system control for storing information.

DETAILED DESCRIPTION

An analog-to-digital (A/D) converter system is provided that compensates for operating variations associated with one or more passive components of the A/D converter. Although the present examples will be illustrated with respect to a differential signal implementation, it is to be appreciated that the present invention is applicable to single ended applications.

Figure 1:
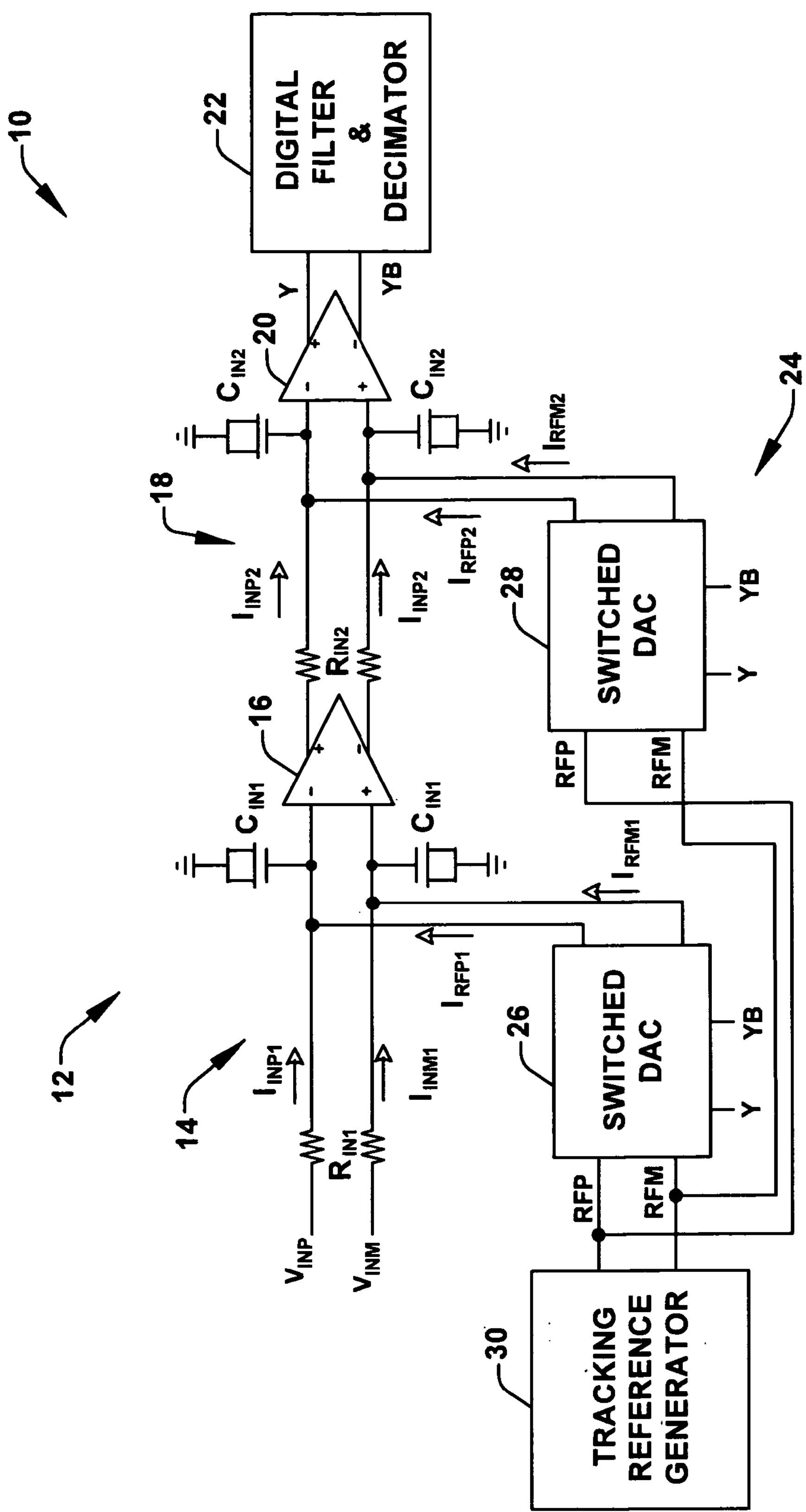
FIG. 1 illustrates a block schematic diagram of an exemplary continuous time sigma delta (ΣΔ) analog-to-digital (A/D) converter system in accordance with an aspect of the present invention.

FIG. 1 illustrates an exemplary continuous time sigma delta (ΣΔ) analog-to-digital (A/D) converter system 10 in accordance with an aspect of the present invention. The A/D converter system 10 can be an Nth order A/D converter, where N is an integer greater than or equal to one. The A/D converter system 10 includes a sigma delta (ΣΔ) modulator portion 12 and a digital filter and decimation portion 22. The sigma delta (ΣΔ) modulator portion 12 receives an analog input signal through a first stage input signal path 14, which is oversampled to perform a noise shaping function and quantized to produce a digital output stream spread over a bandwidth equal to the sampling frequency. The digital output stream is then filtered by a digital filter to remove the out-of-band quantization noise and decimated by the decimator to bring the digital output stream to the Nyquist rate via the digital filter and decimator portion 22.

The first stage input signal path 14 includes input terminals to receive a differential analog input signal ($V_{INP}$, $V_{INM}$). The input terminals are coupled to opposing input terminals of a transconductance amplifier 16 through respective input resistors $R_{IN1}$. The transconductance amplifier 16 provides an output along a second stage input signal path 18 to a comparator 20 that functions as a quantizer to generate a quantized output (Y, YB) to the digital filter and decimator portion 22. The sigma delta modulator portion 12 also includes a feedback path 24 that feeds back the quantized output to a first switched digital-to-analog converter (DAC) 26 that provides feedback to the first stage input signal path 14 and a second switched DAC 28 that provides feedback to the second stage input signal path 18. Both the first switched DAC 26 and the second switched DAC 28 receive reference signals (RFP, RFM) from a tracking reference generator 30. The first switched DAC 26 and the second switched DAC 28 provide reference currents $I_{RFP1}$ and $I_{RFM1}$ to the first stage input signal path 14 and reference currents $I_{RFP2}$ and $I_{RFM2}$ to the second stage input signal path 18 based on the state of the quantized output. That is the state of the output signal determines whether a given reference current is applied to the respective path.

The first stage input signal path 14 includes first input resistors $R_{IN1}$ and integrating capacitors $C_{INT1}$ for each differential input signal path. The second stage input signal path 18 includes second input resistors $R_{IN2}$ and integrating capacitors $C_{INT2}$ for each differential input signal path. Both the input resistors $R_{IN1}$ and $R_{IN2}$ associated with respective differential input signal paths are passive components that can have large variations across process and temperature. Furthermore, the switching DACs 26 and 28 can have passive components that have large variations across process and temperature. For example, the switching DACs 26 and 28 can be switching capacitor DACs that includes passive capacitors that can have large variations across process and temperature. Additionally, the sigma delta (ΣΔ) modulator portion 12 can include a plurality of additional passive components, such as passive components to employ filtering based on the number of orders of an Nth order sigma delta (ΣΔ) modulator portion 12, or additional passive components in the feedback path.

Therefore, the reference signals generated by the tracking reference generator 30 are compensated reference signals that employ matching passive components in the generation of the compensated reference signals. The compensated reference signals include inverse variations that cancel passive component operating variations associated with the first stage input signal path 14, the second stage input signal path 18, and/or the feedback path 24. The employment of the tracking reference generator 30 in accordance with an aspect of the present invention facilitates stability of the sigma delta modulator loop, mitigates performance degradations, mitigates significant errors in the absolute gain and increases final yields of the ADC system 10.

Figure 2:
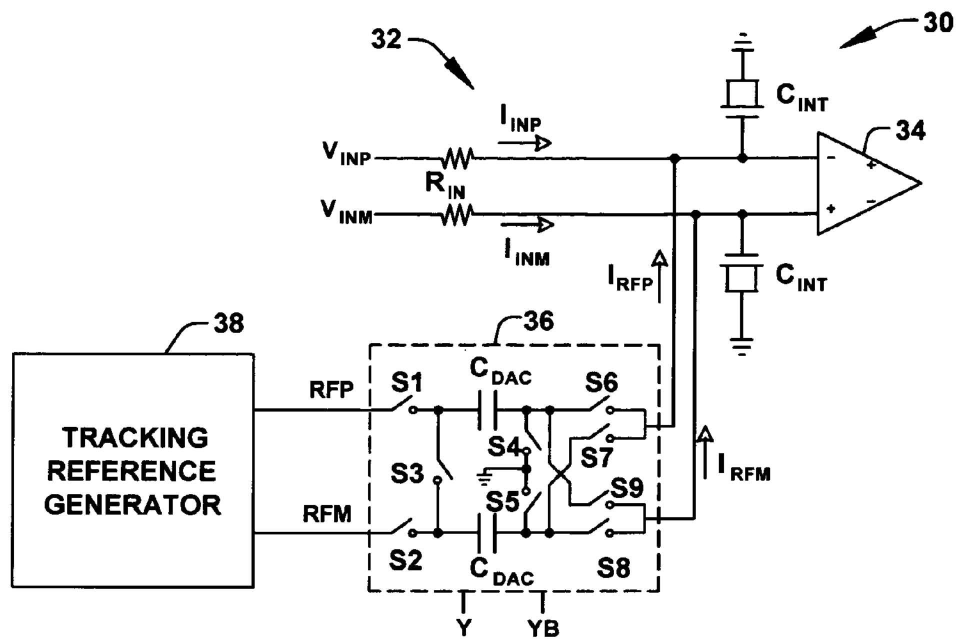
FIG. 2 illustrates a block schematic diagram of a first input signal stage of a continuous time sigma delta (ΣΔ) analog-to-digital (A/D) converter system in accordance with an aspect of the present invention.

FIG. 2 illustrates a first input signal stage 30 of a continuous time sigma delta (ΣΔ) analog-to-digital (A/D) converter system in accordance with an aspect of the present invention. The first input signal stage 30 includes an input signal path 32 that includes input terminals to receive a differential analog input signal ($V_{INP}$, $V_{INM}$). The input terminals are coupled to opposing input terminals of a transconductance amplifier 34 through respective first and second input resistors $R_{IN}$. The first input signal stage 30 includes a switched capacitor DAC 36 that provides feedback to the input signal path 32 based on reference signals (RFP, RFM) from a tracking reference generator 38. The switched capacitor DAC 36 includes a first capacitor ($C_{DAC}$) coupled between a first differential reference signal (RFP) and a first differential input signal path ($V_{INP}$) and a second capacitor ($C_{DAC}$) coupled between a second differential reference signal (RFM) and a second differential input signal path ($V_{INM}$). The switched capacitor DAC 36 also includes a plurality of switches S1–S9 for coupling the reference signals to the input path to generate reference currents $I_{RFP}$ and $I_{RFM}$.

The first and second input resistors $R_{IN}$ are passive components that can have large variations across process and temperature. In one aspect of the inventions, the first and second input resistors $R_{IN}$ are n-well resistors fabricated on a same semiconductor substrate as the remaining components of the continuous time sigma delta analog-to-digital (A/D) converter system. Additionally, the first and second capacitors ($C_{DAC}$) are passive components that have large variations across process and temperature. In one aspect of the invention, the first and second capacitors ($C_{DAC}$) are metal-insulator-metal (MIM) capacitors. Therefore, the reference signals generated by the tracking reference generator 38 are compensated reference signals that employ matching input resistors and matching switching capacitor component types in the generation of the compensated reference signals. The compensated reference signals include inverse variations that cancel passive component operating variations associated with the input resistors $R_{IN}$ and the switching capacitors $C_{DAC}$. It is to be appreciated that the compensated reference signals can also be employed to cancel passive component operating variations associated with the input resistors and the switching capacitors associated with a second input signal stage of the continuous time sigma delta (ΣΔ) analog-to-digital (A/D) converter system, as illustrated in FIG. 1.

Figure 3:
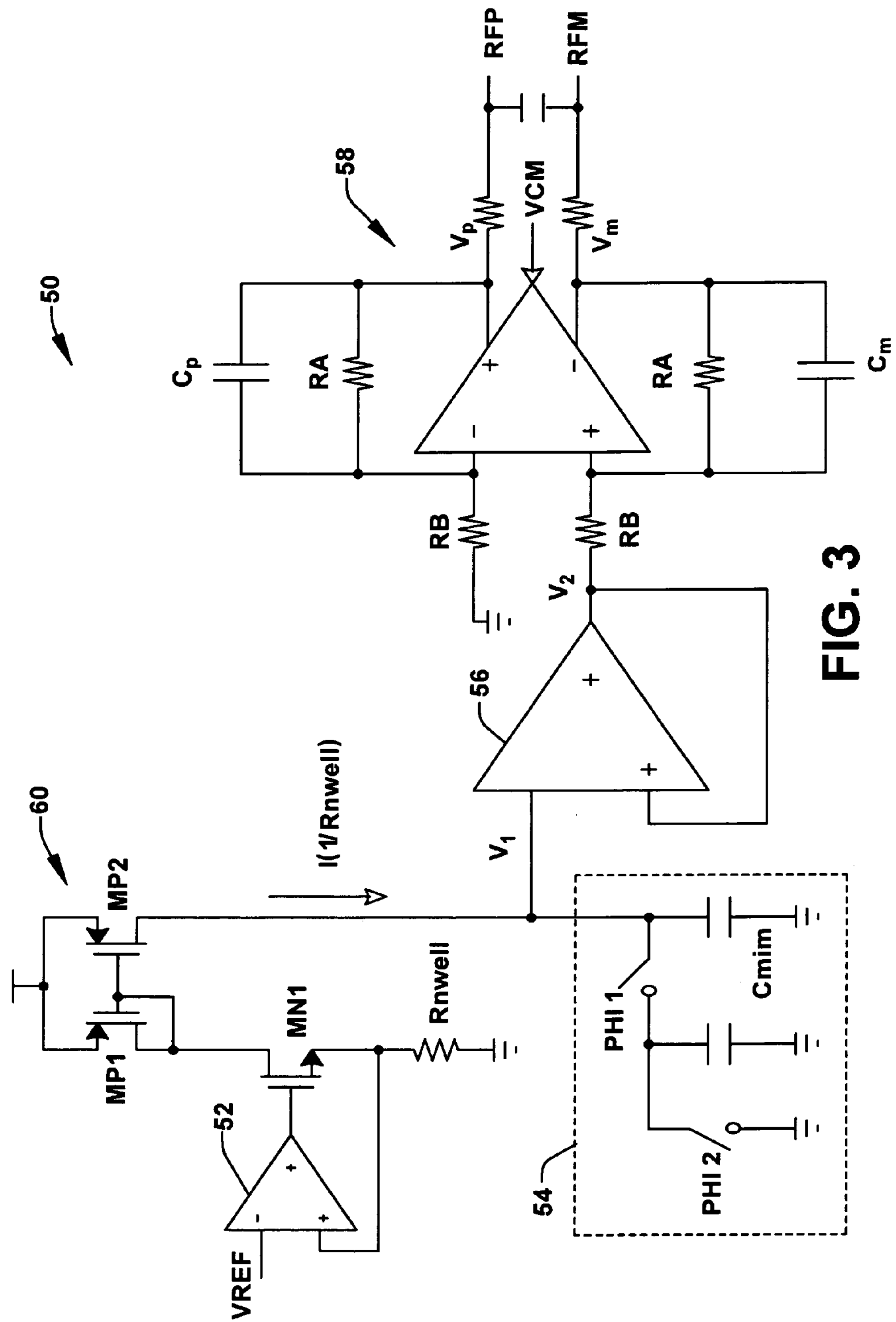
FIG. 3 illustrates a schematic diagram of an exemplary tracking reference generator in accordance with an aspect of the present invention.

FIG. 3 illustrates an exemplary tracking reference generator 50 in accordance with an aspect of the present invention. The tracking reference generator 50 generates reference signals (RFP, RFM) that include inverse variations that cancel variations associated with the input resistors that are n-well resistors and the capacitors of the switching DAC that are MIM capacitors, illustrated in the first input signal stage 30 of FIG. 2. As illustrated in FIG. 2, a switched capacitor DAC structure is provided for realizing the loop feedback of the ΣΔ modulator. The first stage input signal path 32 is a continuous-time system composed of input resistors $R_{IN}$. The input resistors can be selected to be n-well resistors because of the high sheet resistance of this type of resistor. The capacitor $C_{INT}$ is the integrating capacitor in the system. Therefore, the input of the transconductance amplifier 36 is the summing point for the ΣΔ modulator and, therefore quantization error is realized across the capacitors $C_{INT}$. The ratio of feedback DAC capacitor $C_{DAC}$ and the integrating capacitor $C_{INT}$ can be on the order of about 1/100. The currents $I_{INP}$ and $I_{INM}$ are given by the following equations:

$$I_{INP} = \frac{V_{INP}}{R_{IN,nwell}} \qquad \text{EQ. 1}$$

$$I_{INM} = \frac{V_{INM}}{R_{IN,nwell}}$$

These equations reveal that the input currents will vary with the variations in the value of the n-well resistor across process and temperature variations. For example, N-well resistors in Ultra-deep Sub-micron (UDSM) technologies can vary between −30% to +30% across process and temperature. Therefore, the tracking reference generator 50 provides reference currents ($I_{RFP}$ and $I_{RFM}$) with similar variations to mitigate significant errors in the absolute gain requirement of the ΣΔ modulator. Additionally, the tracking reference generator 50 provides compensation for variation of $C_{DAC}$ across process and temperature to mitigate significant errors in the absolute gain requirement of the ΣΔ modulator. The tracking reference generator 50 tracks and compensates to facilitate the stability and performance of the ΣΔ modulator as well.

The tracking reference generator 50 includes an input buffer 52 that buffers a reference voltage ($V_{REF}$) supplied to the tracking reference generator 50, which is converted to current by using a matching n-well resistor ($R_{NWELL}$). The matching n-well resistor is fabricated with the same value, process and substrate as the input resistors $R_{IN}$. Therefore, the n-well resistor ($R_{NWELL}$) is subjected to the same temperature and process variations as the input resistors $R_{IN}$, and therefore is subjected to the same operating variations. The current generated by the reference voltage, buffer and n-well resistor ($R_{NWELL}$) flows through transistors MP1 and MN1. The transistor MP1 and a transistor MP2 are configured in a current mirror arrangement 60 to generate an inverse current $1/R_{NWELL}$. The inverse current $1/R_{NWELL}$ is forced into a switched-capacitor resistor 54 to create a voltage $V_1$. A capacitor $C_{mim}$ used to implement the resistor 54 is a linear Metal-Insulator-Metal (MIM) capacitor, which is the same type of capacitor as the switched capacitor $C_{DAC}$ employed in the feedback DAC 32 of the ΣΔ modulator illustrated in FIG. 2.

The value of the switched-capacitor resistor 54 is given as follows:

$$R_{sc} = \frac{1}{f_s C_{mim}} \Bigg| \quad (2)$$

The voltage $V_1$ is therefore given by:

$$V_1 = \frac{V_{REF}}{R_{nwell}} \frac{1}{f_s C_{mim}} \quad (3)$$

The voltage $V_1$ is then buffered via a buffer 56 and the output of this buffer 56 is provided to a differential two stage amplifier 58. A continuous-time common mode feedback circuit (not shown) adjusts the output common mode of the amplifier 58 and the common mode is set to VCM, where VCM is the common mode of the inputs of the ΣΔ modulator. This common mode can be extracted from the input of the ΣΔ modulator by using a common-mode detect circuit (not shown).

There is a gain of RA/RB from the input to the output of this amplifier 58. The gain can be set to adjust for variation of the value of $V_1$ for different fabrication processes to provide enough headroom to properly bias the transistors at the output stage of the amplifier 58. Consequently, the voltages $V_p$ and $V_m$ at the output of the reference system are given by:

$$V_p = VCM + \frac{(RA/RB)*V_1}{2} \quad (4)$$

$$V_m = VCM - \frac{(RA/RB)*V_1}{2}$$

Hence the differential reference voltage is RA/RB *V1. The reference current $I_{REF}$ ($I_{RFP}$ and $I_{RFM}$ shown in FIG. 2) is then proportional to the following quantities:

$$I_{REF} \propto \frac{V_{REF}}{R_{nwell}} \frac{1}{f_s C_{mim}} f_s C_{DAC} \quad (5)$$

As previously stated, $C_{mim}$ and $C_{DAC}$ are of the same type of capacitor (MIM). By using the same unit type elements in implementing these capacitors and fabricating the capacitors close to each other on a same substrate, good matching can be achieved. Therefore, any variation in the value of this capacitor because of process and temperature will also be cancelled. Hence, proportionality presented in (5) can be simplified to:

$$I_{REF} \propto \frac{V_{REF}}{R_{nwell}} \quad (6)$$

Thus, the reference currents will have the same trend with the input signal currents given in (1). As $R_{nwell}$ increases, both input and the reference will become smaller and vice versa. Consequently, the tracking reference generator 50 will track the variations in passive components. It is to be appreciated that the invention is also applicable to a continuous time ΣΔ modulator in which a resistor is used in the signal input path of the modulator loop and the loop feedback has a different type of passive component. The input path current and the reference path current will have different variations across process and temperature and a tracking reference generator can be implemented with a similar tracking scheme to compensate for these large variations.

Figure 4:
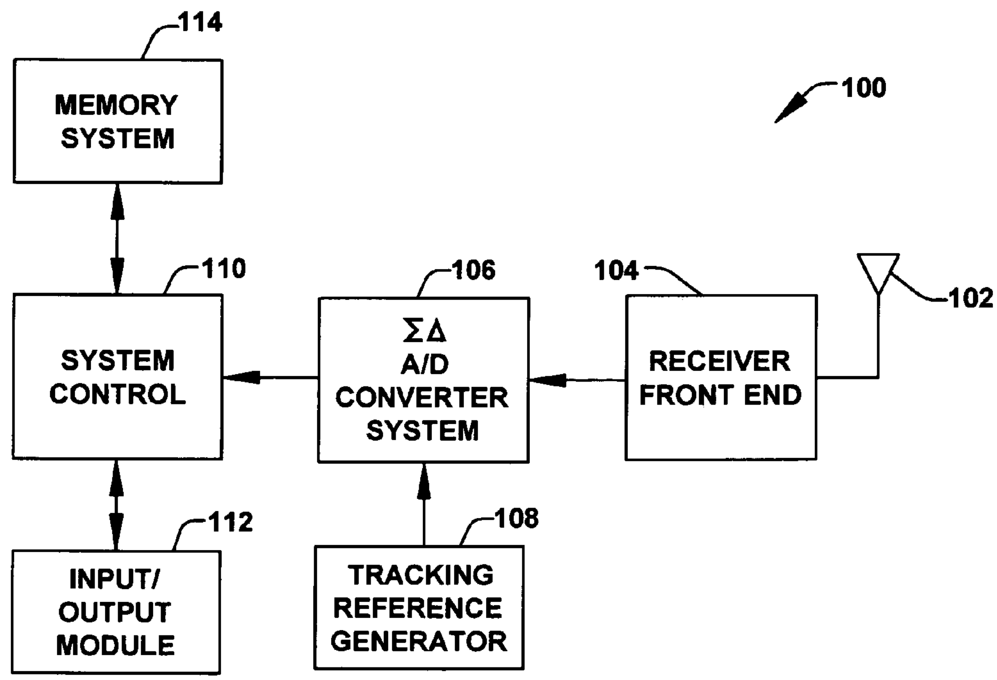
FIG. 4 illustrates a block diagram of a mobile communication device (MCD) in accordance with an aspect of the present invention.

FIG. 4 illustrates a mobile communication device (MCD) 100, such as a cellular telephone. Wireless signals are transmitted from and received at an antenna 102 and down converted, filtered and amplified at a receiver front end 104. The MCD 100 also includes a continuous time sigma delta modulator A/D converter system 106 and a tracking reference generator 108 similar to the systems illustrated in FIGS. 1–3. The tracking reference generator 108 provides compensated reference signals that include inverse variations that cancel operating variations associated with passive components employed in the continuous time sigma delta modulator A/D converter system 106. The passive components (e.g., input resistors, switching capacitors) can be associated with a first stage input signal path, a second stage input signal path, and/or the feedback path.

The compensated reference signals and the wireless signals are provided to the continuous time sigma delta modulator A/D converter system 106, which converts the wireless signals to digital representations, which are provided to a system control 110. The system control can include hardware and/or software to process (e.g., decode, demodulate) the digital representations, such that the signals can be properly interpreted by the controller 110, for example, as voice data for a user of the MCD 100 at an input/output module 112. The MCD 100 also includes a memory system 114. The memory system 114 could include both volatile and non-volatile memory. The non-volatile memory could include information such as stored phone numbers and digital photographs. The volatile memory, which could include one or more SRAM memory circuits, could be used to store connection information, such as control information between the MCD 100 and a cell tower that is serving the MCD 100.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An analog-to-digital (A/D) converter system, comprising:

a sigma delta modulator having at least one passive component and a feedback path that includes at least one switched digital-to-analog converter (DAC); and a tracking reference generator employing matching components to provide compensated reference signals to the at least one switched DAC for providing feedback to the sigma delta modulator, the compensated reference signals having inverse variations that cancel operating variations associated with the at least one passive component.

2. The system of claim 1, wherein the at least one passive component comprises an input resistor to the sigma delta modulator.

3. The system of claim 2, wherein the input resistor comprises an N-well resistor.

4. The system of claim 3, wherein the tracking reference generator comprises a matching N-well resistor fabricated on a same semiconductor substrate as the input resistor, the matching N-well resistor being arranged in a circuit to generate a reference current having inverse variations that cancel operating variations associated with the N-well resistor.

5. The system of claim 2, wherein the at least switched DAC comprises at least one switched capacitor DAC, the compensated reference signals having inverse variations that cancel operating variations associated with the input resistor and at least one capacitor of the at least one switched capacitor DAC.

6. The system of claim 5, wherein the at least one capacitor is a metal-insulator-metal (MIM) capacitor.

7. The system of claim 5, wherein the tracking reference generator comprises a matching N-well resistor fabricated on a same semiconductor substrate as the input resistor and a switched-capacitor resistor that includes a matching capacitor of a same type as the at least one capacitor fabricated on a same semiconductor substrate as the at least one capacitor, the matching N-well resistor and switched-capacitor resistor being arranged in a circuit to generate a reference current having inverse variations that cancel operating variations associated with the N-well resistor and the at least one capacitor.

8. The system of claim 1, wherein the at least one passive component comprises a first input resistor associated with a first stage of the sigma delta modulator and a second input resistor associated with a second stage of the sigma delta modulator, and the at least one switched DAC comprises a first switched capacitor DAC associated with feedback to the first stage of the sigma delta modulator and a second switched capacitor DAC associated with the second stage.

9. The system of claim 8, wherein the at least one passive component further comprises at least one capacitor associated with the first switched capacitor DAC and at least one capacitor associated with the second switched capacitor DAC.

10. A mobile communication unit comprising the system of claim 1.

11. A continuous time sigma delta analog-to-digital (A/D) converter system comprising:

a sigma delta modulator having an input resistor associated with a first stage of the sigma delta modulator and a feedback path that includes a switched capacitor digital-to-analog converter (DAC) with at least one capacitor; and a tracking reference generator that provides compensated reference signals to the switched capacitor DAC for providing feedback to the first stage of the sigma delta modulator, the tracking reference generator having a matching resistor corresponding to the input resistor and a same type capacitor as the at least one capacitor, the matching resistor and same type capacitor being configured to generate compensated reference signals having inverse variations that cancel operating variations associated with the input resistor and the at least one capacitor.

12. The system of claim 11, wherein the input resistor and the matching resistor are N-well resistors fabricated on a same semiconductor substrate, the matching N-well resistor being arranged in a circuit to generate a reference current having inverse variations that cancel variations associated with the N-well resistor.

13. The system of claim 11, wherein the at least one capacitor and the same type capacitor are metal-insulator-metal (MIM) capacitors fabricated on a same semiconductor substrate.

14. The system of claim 11, wherein the matching resistor is arranged to generate an inverse current substantially equal to 1/R, where R is the resistance of the matching resistor, and the same type capacitor is arranged as a switched-capacitor resistor that receives the inverse current to generate a compensation voltage that includes inverse variations that cancel operating variations associated with the input resistor and the at least one capacitor.

15. The system of claim 14, wherein the sigma delta modulator is a differential signal sigma delta modulator operative to receive a differential input signal and generate a differential output signal, and the tracking reference generator further comprises a differential output amplifier that receives the compensation voltage and generates a differential compensation voltage about a common mode voltage set to a common mode voltage of the differential input signal.

16. The system of claim 15, wherein the switched capacitor DAC provides differential reference current signals to the differential input signal based on the differential compensation voltage signal and the differential output signal.

17. The system of claim 11, wherein the sigma delta modulator further comprises a second input resistor associated with a second stage of the sigma delta modulator and the feedback path includes a second switched capacitor DAC with at least one capacitor associated with the second stage of the sigma delta modulator, the tracking reference generator provides compensated reference signals to the second switched capacitor DAC for providing feedback to the second stage of the sigma delta modulator, such that the compensated reference signals have inverse variations that cancel operating variations associated with the second input resistor and the at least one capacitor of the second switched capacitor DAC.

18. A mobile communication unit comprising:

an antenna operative to receive wireless signals;

a receiver front end coupled to the antenna that filters and amplifies the received wireless signals;

a continuous time analog-to-digital (A/D) converter that converts the received wireless signals to a digital representation of the received wireless signals, the A/D converter comprising:

a sigma delta modulator having at least one passive component and a feedback path that includes at least one switched digital-to-analog converter (DAC); and a tracking reference generator employing matching components to provide compensated reference signals to the at least one switched DAC for providing feedback to the sigma delta modulator, the compensated reference signals having inverse variations that cancel operating variations associated with the at least one passive component;

a system control that processes the digital representation of the received wireless signal; and a memory coupled to the system control for storing information.

19. The mobile communication unit of claim 18, wherein the at least one passive component comprises an N-well input resistor and the tracking reference generator comprises a matching N-well resistor fabricated on a same semiconductor substrate as the N-well input resistor, the matching N-well resistor being arranged in a circuit to generate a reference current having inverse variations that cancel operating variations associated with the N-well input resistor.

20. The mobile communication unit of claim 18, wherein the at least one passive component comprises at least one capacitor associated with the at least one switched DAC, the compensated reference signals having inverse variations that cancel operating variations associated with the input resistor and the at least one capacitor.

* * * * *